United States Patent
Magni et al.

(10) Patent No.: US 9,324,639 B2
(45) Date of Patent: Apr. 26, 2016

(54) ELECTRONIC DEVICE COMPRISING AN IMPROVED LEAD FRAME

(71) Applicant: STMicroelectronics S.r.l., Agrate Brianza (IT)

(72) Inventors: Pierangelo Magni, Villasanta (IT); Roberto Rossi, Villasanta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/744,766

(22) Filed: Jun. 19, 2015

(65) Prior Publication Data

US 2016/0005678 A1   Jan. 7, 2016

(30) Foreign Application Priority Data

Jul. 3, 2014   (IT) .............................. MI2014A1213

(51) Int. Cl.
| | | |
|---|---|---|
| *H01L 23/495* | (2006.01) | |
| *H05K 5/02* | (2006.01) | |
| *H01L 21/00* | (2006.01) | |
| *H01L 21/48* | (2006.01) | |
| *H01L 23/48* | (2006.01) | |
| *H01L 23/00* | (2006.01) | |

(52) U.S. Cl.
CPC ...... *H01L 23/49527* (2013.01); *H01L 21/4825* (2013.01); *H01L 23/481* (2013.01); *H01L 23/4952* (2013.01); *H01L 23/49503* (2013.01); *H01L 23/49531* (2013.01); *H01L 23/49541* (2013.01); *H01L 24/45* (2013.01); *H01L 24/48* (2013.01); *H01L 2224/48227* (2013.01)

(58) Field of Classification Search
CPC ............ H01L 2225/0651; H01L 23/50; H01L 23/4951; H01L 23/49811; H01L 23/49558; H01L 24/48; H01L 23/4952; H01L 23/481; H01L 23/49838; H01L 24/45; H05K 3/3644
See application file for complete search history.

(56) References Cited

U.S. PATENT DOCUMENTS

| | | | |
|---|---|---|---|
| 5,399,904 | A | 3/1995 | Kozono |
| 6,340,839 | B1 | 1/2002 | Hirasawa et al. |
| 7,948,078 | B2 * | 5/2011 | Hiraga ......................... 257/724 |
| 2010/0264533 | A1 | 10/2010 | Chen |

FOREIGN PATENT DOCUMENTS

| | | |
|---|---|---|
| EP | 0381383 A2 | 8/1990 |
| JP | S63244747 A | 10/1988 |

OTHER PUBLICATIONS

IT Search Report and Written Opinion for MI2014A001213 dated Mar. 30, 2015 (8 pages).

* cited by examiner

*Primary Examiner* — Alonzo Chambliss
(74) *Attorney, Agent, or Firm* — Gardere Wynne Sewell LLP

(57) ABSTRACT

An electronic device includes a chip and a support element which supports the chip. Leads are provided to be electrically coupled to at least one terminal of the chip. A coupling element is mounted to a free region of the support element that is not occupied by the chip. The coupling element includes a conductive portion electrically connected to at least one lead and to the at least one terminal of the chip to obtain an electrical coupling.

12 Claims, 6 Drawing Sheets

ELECTRONIC DEVICE COMPRISING AN IMPROVED LEAD FRAME

PRIORITY CLAIM

This application claims priority from Italian Application for Patent No. MI2014A001213 filed Jul. 3, 2014, the disclosure of which is incorporated by reference.

TECHNICAL FIELD

The solution according to embodiments generally relates to the field of electronics. More specifically, such solution relates to electronic devices based on lead frames.

BACKGROUND

Each electronic device typically comprises a chip (one or more) of semiconductor material for implementing functionalities of the electronic device, a package wherein the chip is embedded to protect it and to allow access to terminals thereof, and a conductive structure (referred to as lead frame) for mechanically and electrically coupling the chip to external circuits and/or electronic components (for example, on a printed circuit board or PCB).

The lead frame typically comprises a support element for mechanically supporting the chip, and a plurality of leads for mounting the electronic device on the PCB and for electrical connection of the chip.

Inside the package, the leads are electrically connected to respective terminals of the chip by means of wire connections (wire bonding), whereas, outside the package, the leads are electrically connected to conductive pads of the PCB, for example by means of a reflow thermal process.

However, the wire bonding introduces inductive components, which may affect the operation of the electronic device. In particular, in electronic devices wherein the support element is sized and arranged so as to facilitate also the dissipation of heat from the chip, typically the chip (i.e., its terminals) and the leads may be too distant from each other (reason why wire bonding having significant length, and hence inductance, is required).

Furthermore, in order to connect the chip to electronic components external to it (for example, passive electronic components such as resistors or capacitors), it is necessary to mount the electronic components on the PCB and make electrical connections (for example, conductive tracks) on the PCB between these electronic components and the respective leads of the electronic device. However, this determines an excessive area occupation on the PCB (as well as a difficult optimization of the same, in terms of cost and/or size), and an excessive distance between the chip and these electronic components (with resulting reduction in performance of the electronic device).

SUMMARY

Therefore, the Applicant has noticed that the known solutions are not able to meet the modern technological requirements, and has devised a solution (concerning an electronic device and a method of making it) able to make efficient electrical connections between the terminals, the leads and/or the electronic components external to the chip (and internal to the package), without increasing the overall size of the electronic device (while, on the contrary, reducing the area occupation on the PCB).

One aspect of the solution according to embodiments proposes an electronic device. The electronic device comprises a chip of semiconductor material for implementing functionalities of the electronic device, a support element for supporting the chip, and a plurality of leads each one adapted to be electrically coupled to at least one terminal of the chip. The electronic device further comprises a coupling element on a free region of the support element not occupied by the chip, said coupling element comprising a conductive portion electrically connected to at least one lead and to the at least one terminal of the chip to obtain said electrical coupling.

According to an embodiment, the conductive portion is electrically connected to the at least one lead by a wire connection between the at least one lead and a region of the conductive portion proximal to the at least one lead, and the conductive portion is electrically connected to the at least one terminal by a wire connection between the at least one terminal and a region of the conductive portion proximal to the at least one terminal.

According to an embodiment, the electronic device further comprises an electronic component adapted to be electrically coupled to the at least one lead, said electronic component being mounted, within the electronic device, on the coupling element, and being electrically connected, within the electronic device, to said at least one lead and to said at least one terminal of the chip.

According to an embodiment, said conductive portion comprises a first conductive portion electrically connected to a first terminal of the electronic component, and a second conductive portion, electrically insulated from the first conductive portion, electrically connected to a second terminal of the electronic component. The first and the second conductive portions are further connected, respectively, to the at least one lead and to the at least one terminal of the chip.

According to an embodiment, the first and second conductive portions are electrically connected to the first and second terminals of the electronic component by means of an electrically conductive glue.

According to an embodiment, the electronic device further comprises a conductive through-element between an upper surface and a lower surface of the coupling element, the conductive through-element contacting the support element for electrically coupling at least one further terminal of the chip to the support element by said conductive through-element.

According to an embodiment, said conductive through-element extends, in plan view, around the chip.

Another aspect of the solution according to embodiments proposes a method for manufacturing an electronic device. The method comprises the following steps. A conductive structure comprising a support element is provided for supporting a chip of semiconductor material of the electronic device, and a plurality of leads, each one being adapted to be electrically coupled to at least one terminal of the chip, are provided. A coupling element is provided that comprises a conductive portion. The chip is fixed on the support element, and the coupling element is fixed on a free region of the support element not occupied by the chip. The conductive portion of said coupling element is electrically connected to at least one lead and to the at least one terminal of the chip to obtain said electrical coupling.

According to an embodiment, the step of providing a coupling element comprises mounting, on said coupling element, an electronic component, and the step of electrically connecting the conductive portion of said coupling element to at least one lead and to the at least one terminal of the chip comprises electrically connecting a first conductive portion of said conductive portion to a first terminal of the electronic component and to the at least one lead, and electrically connecting a second conductive portion of said conductive portion to a second terminal of the electronic component and to the at least one terminal of the chip (with the second conductive portion that is electrically insulated from the first conductive portion).

According to an embodiment, the step of providing a coupling element comprises forming a conductive through-element between an upper surface and a lower surface of the coupling element and that contact the support element, the method further comprising electrically coupling at least one further terminal of the chip to the support element by means of said conductive through-element.

BRIEF DESCRIPTION OF THE DRAWINGS

The solution according to embodiments, as well as further features and the related advantages, will be better understood with reference to the following detailed description, given by way of indicative and non-limiting example only, to be read in conjunction with the accompanying figures (wherein corresponding elements are indicated with same or similar references and their explanation is not repeated for the sake of brevity), wherein.

DETAILED DESCRIPTION OF THE DRAWINGS

Figure 1A:
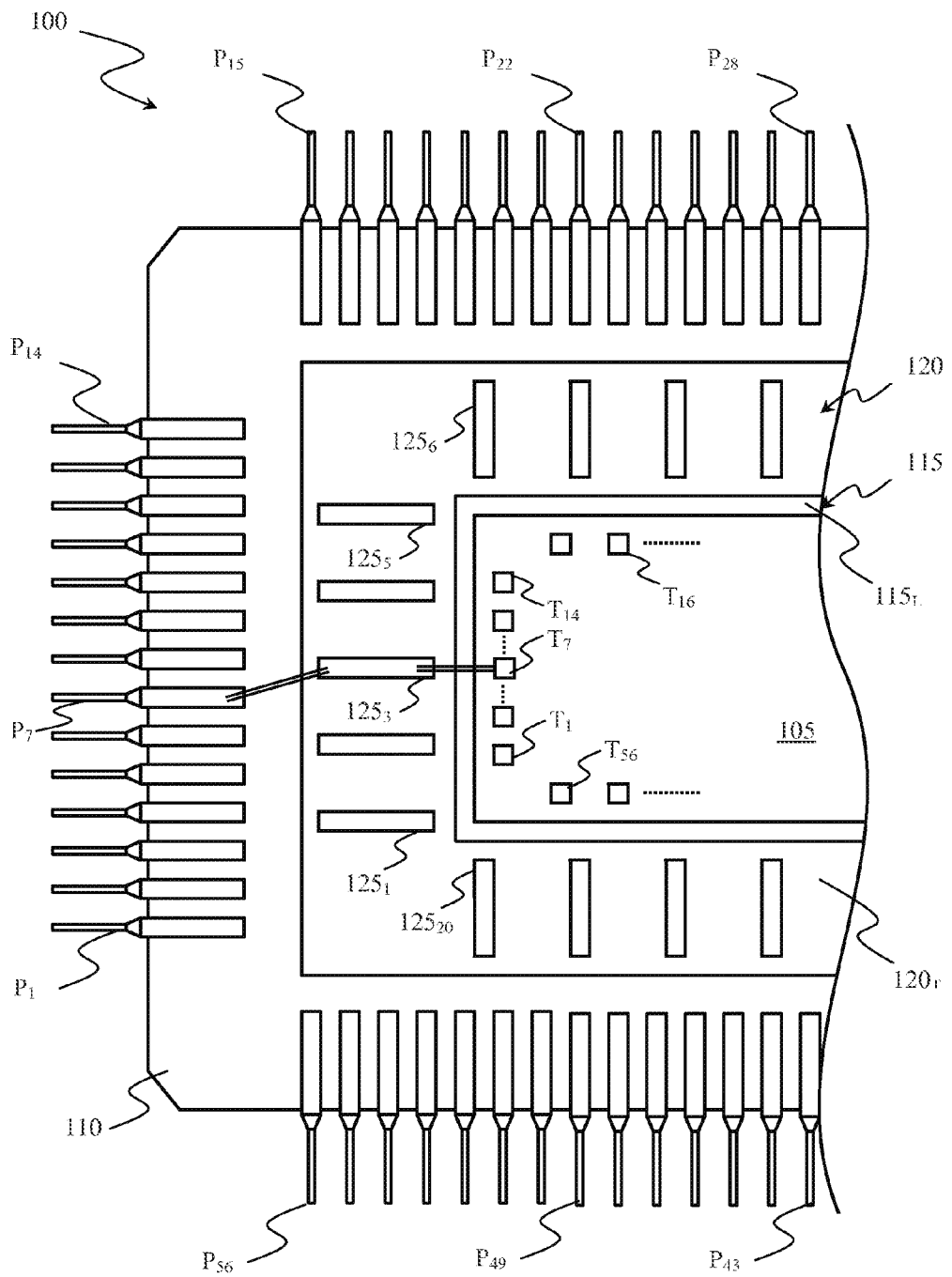
FIGS. 1A-1B show a top see-through view and a sectional side view, respectively, of a portion of an electronic device.
Figure 1B:
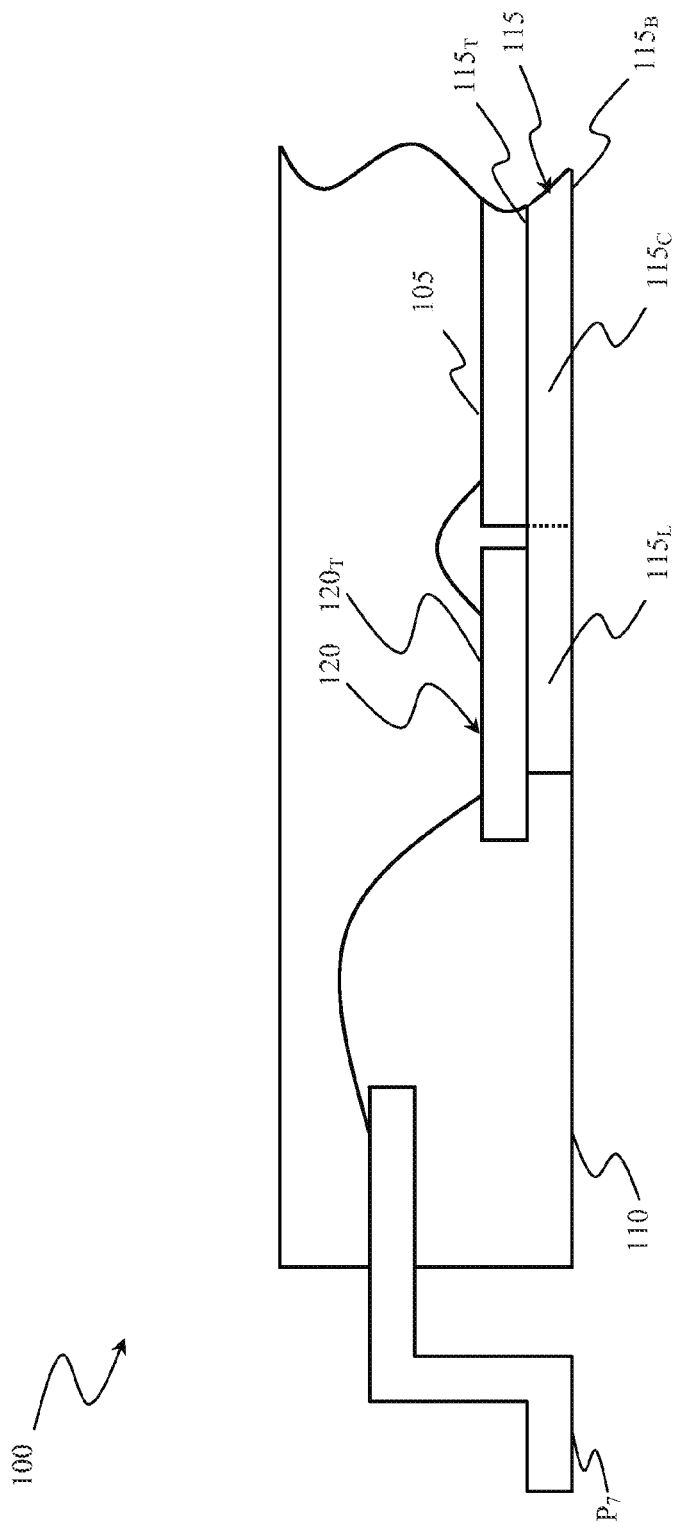

With particular reference to FIGS. 1A-1B, they show a top see-through view and a sectional side view, respectively, of a portion of an electronic device 100 according to an embodiment. In the following, for the sake of exposition brevity, only components and aspects of the electronic device 100 relevant to the understanding of the present invention will be introduced and described. Furthermore, directional terminology (for example, top, bottom, side, central, longitudinal, transverse) associated with these elements will be used only in connection to their orientation in the figures, and will not be indicative of any specific use orientation thereof (between the various possible orientations). The term "substantially" will be instead used for taking into consideration (desired or undesired) manufacturing tolerances.

The electronic device 100 comprises a chip 105 of semiconductor material for implementing specific functionalities, and a package 110 of electrically insulating material (for example, parallelepiped-shaped) for embedding the chip 105.

The electronic device 100 also comprises a conductive structure, referred to as lead frame, generically configured for mechanically and electrically coupling the chip 105 to circuits and/or electronic components external to it—typically, on a printed circuit board (PCB, not shown).

The lead frame comprises a conductive support element (e.g., a plate) 115, which is configured for mechanically supporting the chip 105 and dissipating the heat produced by the electronic device 100 outside the package 110. In this respect, the support element 115, housed within the package 110, has an upper surface $115_T$ on which the chip 105 is fixed (for example, by gluing), and a lower surface $115_B$ exposed (at least in part) from the package 110 and facing, in use, the PCB (in order to dissipate the heat produced by the chip 105 towards the PCB).

The support element 115 extends, in plan view, beyond the chip 105 (so as to provide efficient heat dissipation). In the exemplary illustrated embodiment, the support element 115 comprises a (e.g., central) region $115_C$, occupied by the chip 105, and a (e.g., side) region $115_L$, not occupied by (free from) the chip 105, which extends around the central region $105_C$ (for example, along the whole perimeter thereof). In any way, shape, size and arrangement of the occupied region $115_C$ and of the free region $115_L$ are not to be understood as limiting, as they may be arbitrarily chosen based on specific design considerations (e.g., shape and size of the chip 105, and arrangement of the chip 105 on the support element 115).

The lead frame also comprises a plurality of (e.g., two or more) leads $P_i$ (i=1, 2, 3, . . . , I—with I=56 in the example at issue) for mounting of the electronic device 100 on the PCB and for electrical connection of the chip 105.

More particularly, inside the package 110, each pin $P_i$ is suitable to be electrically coupled to (one or more) corresponding terminals $T_j$ of the chip 105 (j=1, 2, 3, . . . , J—with J=I=56 in the example at issue) by wire bonding, whereas, outside of the package 110, each pin $P_i$ is suitable to be electrically connected to (one or more) conductive pads of the PCB, for example by means of a reflow thermal process.

The electronic device 100 further comprises, on (or, on at least part of) the free region $115_L$ of the support element 115, a coupling element 120. As will be better discussed in the following, such a coupling element 120 allows coupling in an electrically efficient manner the terminals $T_j$ to the leads $P_i$ and/or to electronic components external to the chip.

The coupling element 120 is firmly fixed on the free region $115_L$, for example by means of a glue (preferably, an electrically conductive glue having high content of silver) or by means of a mechanical coupling (for example, a pin, not shown). Preferably, as illustrated by way of example, the coupling element 120 extends in plan view beyond the peripheral edge of the free region $115_L$ (so as to make the wire bonding shorter, as will become clear shortly, and to expose a wider surface to encapsulation resins, thereby increasing adhesion thereof).

The coupling element 120 is, preferably, conceptually analogous to a PCB, i.e. it comprises one or more electrically conductive portions in an electrically non-conductive substrate. As discussed in greater detail hereinafter in connection to specific embodiments, such conductive portions are electrically connected (i.e., they are suitable to be electrically connected) to one or more leads $P_i$ of the electronic device 100 and to the terminals $T_j$ of the chip 105 associated therewith for achieving the electrical coupling between them.

As can be better appreciated in FIG. 1A, the coupling element 120 comprises a number K of electrically conductive portions $125_k$ (k=1, 2, . . . , K, with K=20 in the example at issue), separated (so as to be electrically insulated) from each other, and exposed (at least in part) on an upper surface $120_T$ of the coupling element 120 (opposite a lower surface $120_B$ that, in use, faces the free region $115_L$).

Preferably, as illustrated, these conductive portions $125_k$ are in the form of longitudinal strips, namely each one extend between opposite edges of the coupling element 120.

In the exemplary embodiment illustrated in FIGS. 1A and 1B, at least part of the connections between one or more terminals $T_j$ of the chip 105 (for example, the terminal $T_7$) and the respective leads $P_i$ (for example, the lead $P_7$) are made, in an indirect manner, by means of "interposition" of the conductive portions $125_k$ (for example, the conductive portion $125_3$)—for example, with a first wire bonding between the terminal $T_7$ and one end of the conductive portion $125_3$ (i.e., the region of the conductive portion $125_3$ proximal to the lead $P_7$), and a second wire bonding between the opposite end of the same conductive portion $125_3$ (i.e., the region of the conductive portion $125_3$ proximal to the terminal $T_7$) and the lead $P_7$.

In this way, the overall length of the wire bonding required to make the electrical connection between the terminal $T_j$ and the lead $P_i$ (and, therefore, the inductance associated with it) is reduced compared to the known solutions (according to which the same electrical connection would be instead made in a direct manner, i.e. by means of a single wire bonding between the same terminal $T_j$ and the same lead $P_i$).

As will be readily understood, the extent of this (inductance) reduction depends on parameters (such as shape, size and arrangement of the conductive portions $125_k$) that may vary according to specific design requirements. Similarly, the number of conductive portions $125_k$ herein considered is not to be understood in a restrictive way. In this regard, a smaller number of conductive portions $125_k$, or a higher number thereof may be provided (at most, it is possible to provide a number of conductive portions $125_k$ equal, or substantially equal, to the number of terminals $T_j$ and/or to the number of leads $P_i$, so that each connection between a terminal $T_j$ and a corresponding lead $P_i$ benefits of the advantages described above).

It should be noted that the above advantages have been achieved without increasing the overall size of the electronic device 100—indeed, as discussed above, the free region $115_L$ is provided only for purposes of heat dissipation, so that the coupling element 120, arranged on the free region $115_L$, occupies a volume of the electronic device 100 that is usually unused.

Figure 2A:
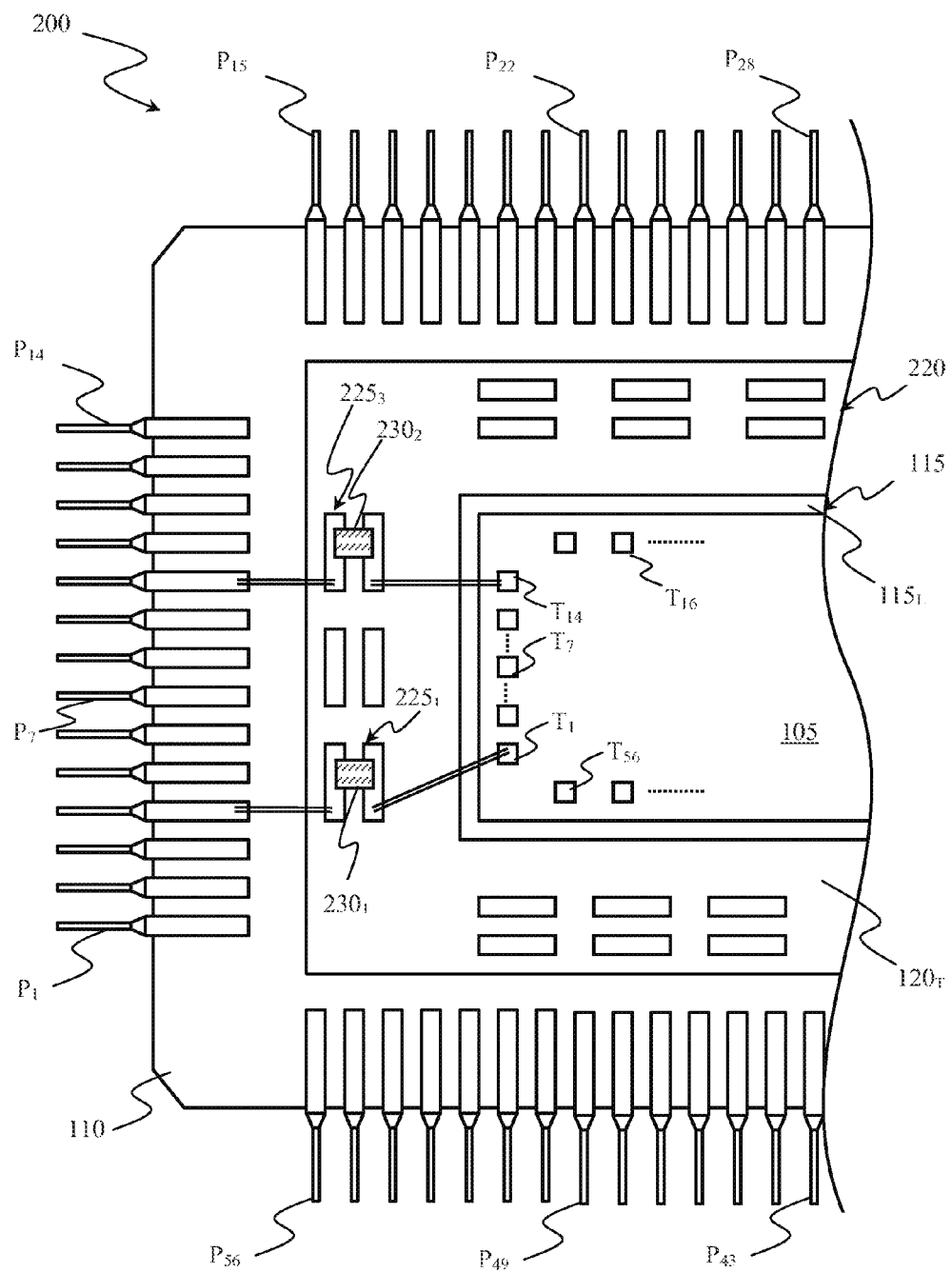
FIGS. 2A-2B show a top see-through view and a sectional side view, respectively, of a portion of an electronic device.
Figure 2B:
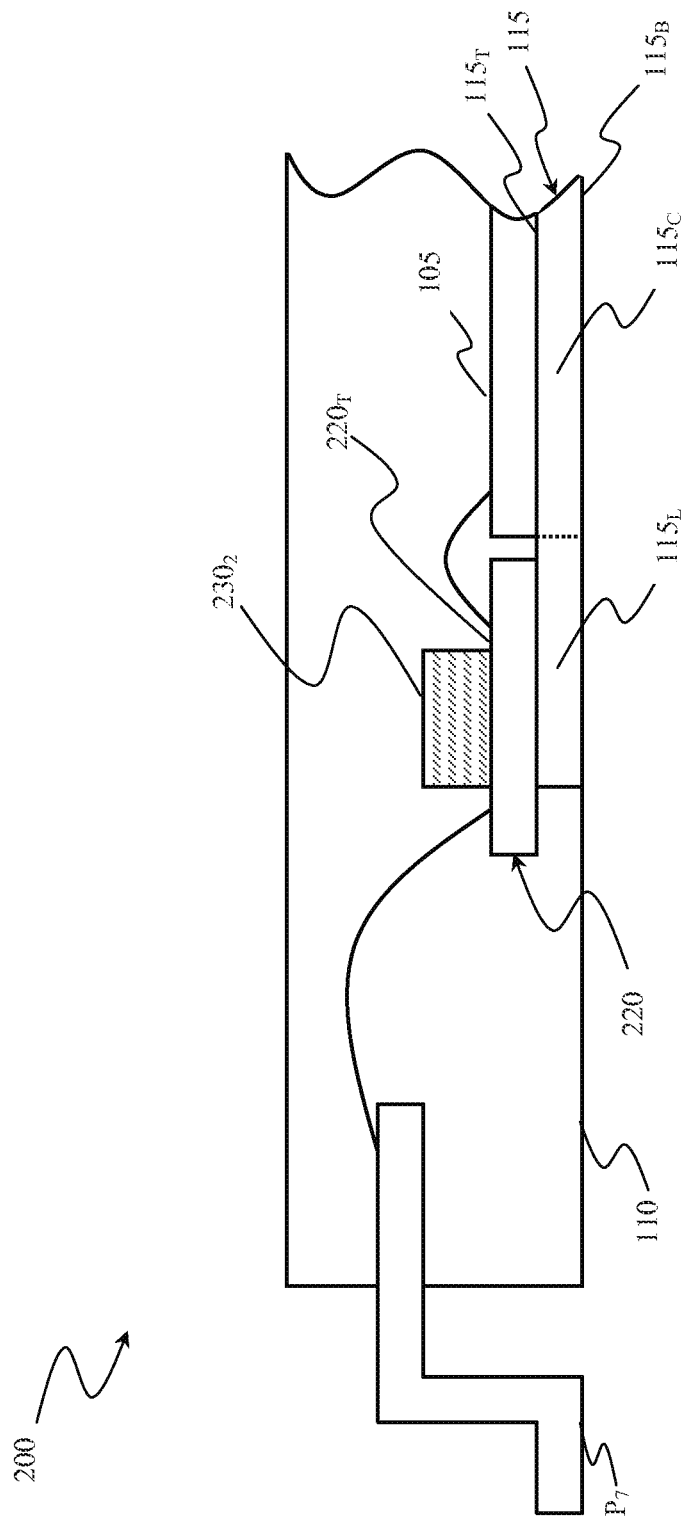

Turning now to FIGS. 2A-2B, they show a top see-through view and a sectional side view, respectively, of a portion of an electronic device 200 according to another embodiment.

Unlike the electronic device 100, the electronic device 200 comprises a coupling element 220 configured for mechanically supporting and electrically connecting (to the plate chip 105) one or more electronic components (external to the chip 105) inside the package 110.

As may be better appreciated in FIG. 2A, the coupling element 220 comprises a number Q of conductive portions pairs $225_q$ (q=1, 2, ..., Q, with Q=12 in the example at issue), spaced apart (so as to be electrically insulated) from one another, and exposed (at least in part) on the upper surface $220_T$ of the coupling element 220. Furthermore, the conductive portions of each pair $225_q$ (for example, in the form of parallel transverse strips) are electrically insulated from each other so as to contact respective terminals of an electronic component (as discussed below).

According to the embodiment illustrated in FIGS. 2A-2B, one or more electronic components (such as the electronic components $230_1$, $230_2$) are mounted on the coupling element 220 (i.e., on the upper surface $220_T$ thereof) so as to be electrically connected to respective terminals $T_j$ of the chip 105 and to respective leads $P_i$ inside the package 110 (as discussed below).

In the exemplary considered embodiment, these electronic components $230_1$, $230_2$ comprise, but are not limited to, passive electronic components (for example, resistors or capacitors) having two terminals. As will become clear shortly, the arrangement/making of the electrically conductive portions in pairs reflects the two-terminal structure, herein exemplary assumed, of the electronic components $230_1$, $230_2$ (it being understood that the principles herein may also be applied to electronic components with a different number of terminals, in which case shape, size and arrangement of the conductive portions $225_q$ may also differ from those shown here).

In the illustrated example, the terminals of each electronic component $230_1$, $230_2$ are fixed to different conductive portions of the respective pair $225_1$, $225_3$—for example, a first wire bonding is made between the terminal $T_1$, $T_{14}$ and a conductive portion of the respective pair $225_1$, $225_3$ (advantageously, the conductive portion of the pair $225_1$, $225_3$ proximal to the terminal $T_1$, $T_{14}$), and a second wire bonding is made between the other conductive portion of the same pair $225_1$, $225_3$ (advantageously, the conductive portion of the pair $225_1$, $225_3$ proximal to the lead $P_1$, $P_{14}$) and the lead $P_1$, $P_{14}$, respectively.

In order to connect a terminal of the chip (and a corresponding lead) to an electronic component, the known solutions provide, on the contrary, to mount the electronic component on the PCB, to provide a wire bonding between the terminal and the lead, and to make an electrical connection (typically by means of a conductive track on the PCB) between the lead and the electronic component.

Making electronic components inside the electronic device (for the same overall size thereof) has several advantages.

First of all, this entails a smaller occupation of area on the PCB and, hence, a more simple optimization thereof—in particular, size and cost of the PCB may be appreciably reduced.

Furthermore, the reduced distance between the chip and the electronic components guarantees an optimal "communication" between them, and hence high performance.

Finally, the overall length (and, hence, the inductance associated therewith) of the wire bonding required to make the electrical connections between the terminals, the electronic components, and the leads is significantly reduced.

It should be noted that the above advantages have been achieved without increasing the overall size of the electronic device 200—indeed, as discussed above, the free region $115_L$ is provided only for heat dissipation purposes, so that the interconnection element 120, which is arranged on the free region $115_L$, and the electronic components $230_1$, $230_2$, which are arranged on the coupling element 120, occupy a volume of the electronic device 200 that is usually unused.

Figure 3A:
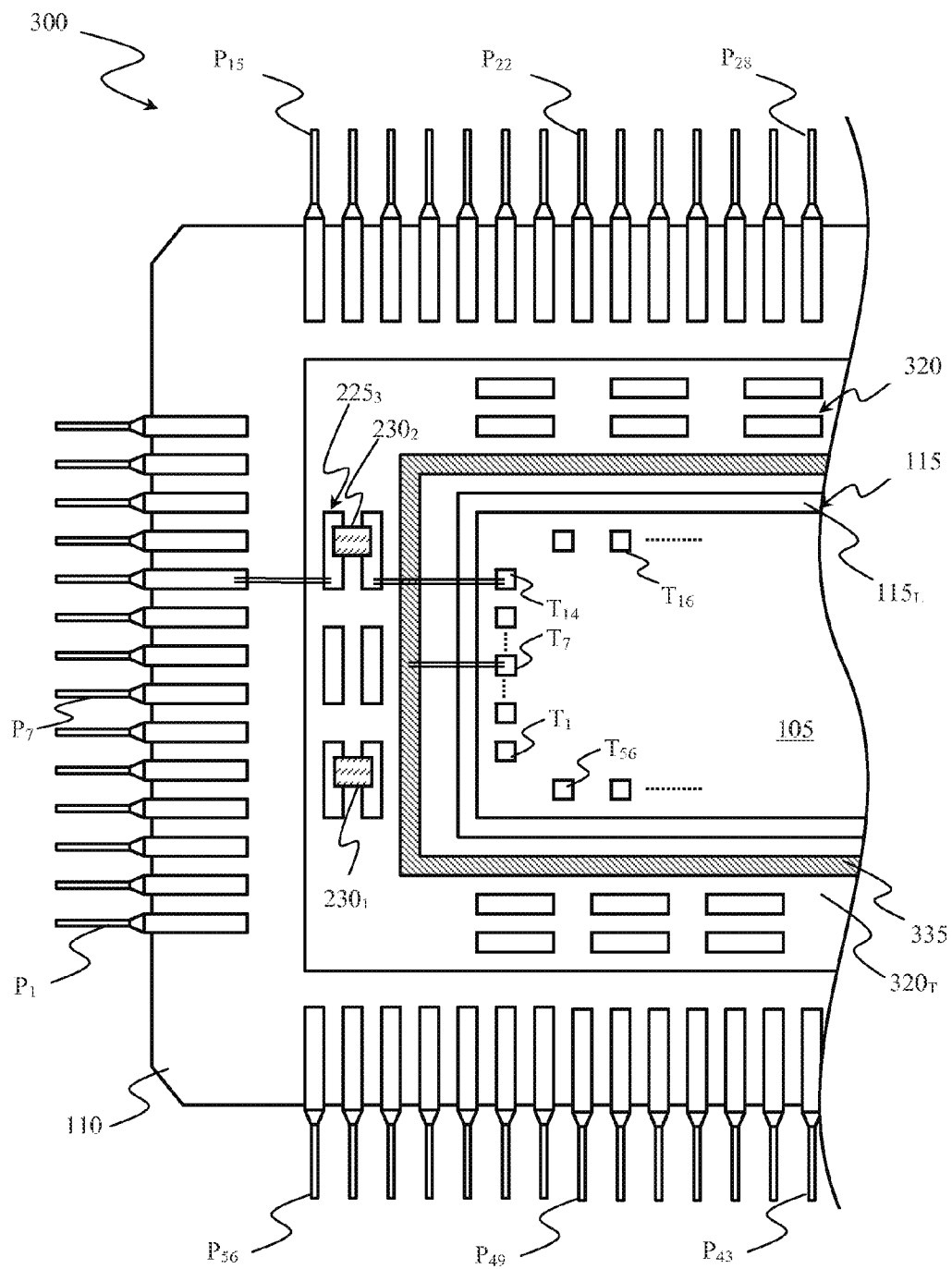
FIGS. 3A-3B show a top see-through view and a sectional side view, respectively, of a portion of an electronic device.
Figure 3B:
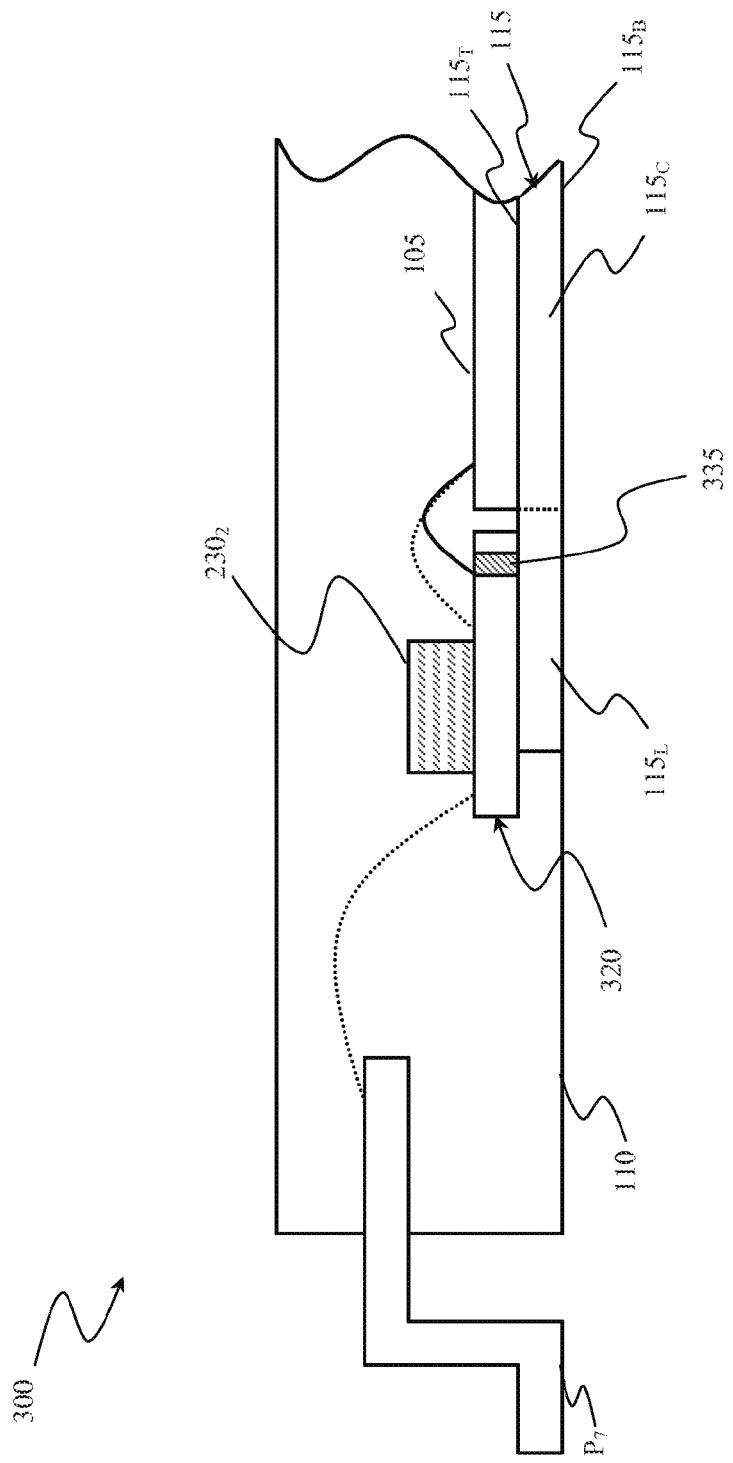

With reference now to FIGS. 3A-3B, they show a top see-through view and a sectional side view, respectively, of a portion of an electronic device 300 according to a further embodiment of the present invention.

The electronic device 300 comprises, in addition to the previous one, a conductive through-element (via) 335 between the top surface $320_T$ and the bottom surface $320_B$ of the coupling element 320, down to contact the support element 115.

In the exemplary considered embodiment, the support element 115 acts, as well as a heat dissipation element, also as a ground plane (i.e., it is biased at a ground voltage—for example, 0V), so that the conductive through-element 335 is electrically connected to the ground plane. This allows connecting the terminals $T_j$ (i.e., one or more of them) to the ground voltage by means of the conductive through-element 335 (instead of directly contacting the support element 115), and then using wire bonding having reduced length (with advantages similar to those stated above).

It should be noted that in this embodiment the coupling element 320 is advantageously fixed to the free region $115_L$ of the support element 115 by means of an electrically conductive glue, especially at the interface between the support element 115 and the conductive through-element 335 (so as to ensure an effective electrical contact between them).

Advantageously, as visible in FIG. 3B, the conductive through-element 335 extends in a continuous manner "around" the chip 105 (in the form of a conductive via line), so that, starting from any terminal $T_j$ (and irrespective of its position on the chip 105), the wire bonding may be made the shortest possible (consistently with other design rules).

As will be understood, the embodiments illustrated in FIGS. 1A-1B, 2A-2B and 3A-3B may be combined according to specific design requirements. For example, according to a particularly advantageous embodiment (not shown), unused conductive portions pairs (i.e., conductive portions pairs not associated with any electronic component) may be employed to reduce the overall length of the wire bonding (and, hence, the inductance associated therewith). To the same purpose, the coupling element may be provided, alternatively, both with transverse conductive portions (such as those of the embodiments of FIGS. 2A-2B and 3A-3B), and with longitudinal conductive portions (such as those of the embodiments of FIGS. 1A-1B).

The embodiments discussed above are further advantageous in that they require, compared to the production processes of the known solutions, only few, simple and short auxiliary operations, which, however, do not determine any significant costs increase (i.e., no costs increase not justified/balanced/compensated by improvements in terms of electrical performance and area occupation on the PCB).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

In particular, similar considerations apply if the electronic device has a different structure or comprises equivalent elements; moreover, the elements may be separated between them or combined together, in whole or in part. For example, each element of the integrated device may have any shape and/or size, and may be made of any other material.

The design of the electronic device can also be created in a programming language; in addition, if the designer does not manufacture the integrated devices or the masks, the design can be transmitted through physical means to others. In any case, the resulting integrated device may be distributed by its manufacturer in the form of a raw wafer, such as bare die, or in packages. Moreover, the proposed structure may be integrated with other circuits in the same chip, or may be mounted in intermediate products (such as motherboards) and coupled to one or more other chips (such as a processor or a memory).

In any case, the electronic device of the present invention is suitable to be used in complex systems (such as mobile phones).

Finally, the production processes described above are merely illustrative and in no way limitative. For example, the same result may be achieved by means of equivalent processes (using similar steps, removing some non-essential steps, or adding additional optional steps); moreover, the steps may be performed in different order, in parallel or overlapping (at least partly).

The invention claimed is:

1. An electronic device, comprising:
a chip of semiconductor material configured to implement functionalities of the electronic device,
a support element for supporting the chip,
a plurality of leads each one adapted to be electrically coupled to at least one terminal of the chip,
a coupling element on a free region of the support element that is not occupied by the chip, said coupling element comprising a conductive portion electrically connected to at least one lead and to the at least one terminal of the chip to obtain said electrical coupling, and
a conductive through-element between an upper surface and a lower surface of the coupling element, the conductive through-element contacting the support element for electrically coupling at least one further terminal of the chip to the support element by said conductive through-element, said conductive through-element extending, in plan view, around the chip.

2. The electronic device according to claim 1, wherein the conductive portion is electrically connected to the at least one lead by a wire connection between the at least one lead and a region of the conductive portion proximal to the at least one lead, and wherein the conductive portion is electrically connected to the at least one terminal by a wire connection between the at least one terminal and a region of the conductive portion proximal to the at least one terminal.

3. The electronic device according to claim 1, further comprising an electronic component configured to be electrically coupled to the at least one lead, said electronic component being mounted, within the electronic device, on the coupling element, and being electrically connected, within the electronic device, to said at least one lead and to said at least one terminal of the chip.

4. The electronic device according to claim 3, wherein said conductive portion comprises a first conductive portion electrically connected to a first terminal of the electronic component, and a second conductive portion, electrically insulated from the first conductive portion, electrically connected to a second terminal of the electronic component, the first and the second conductive portions being further connected, respectively, to the at least one lead and to the at least one terminal of the chip.

5. A method for manufacturing an electronic device, comprising:
providing a conductive structure comprising a support element configured to support a chip of semiconductor material of the electronic device, and a plurality of leads, each lead configured to be electrically coupled to at least one terminal of the chip,
providing a coupling element comprising a conductive portion and forming a conductive through-element between an upper surface and a lower surface of the coupling element and contacting the support element, the conductive through-element extending, in plan view, around the chip, fixing the chip on the support element, fixing said coupling element on a free region of the support element that is not occupied by the chip, electrically connecting the conductive portion of said coupling element to at least one lead and to the at least one terminal of the chip to obtain said electrical coupling, and electrically coupling at least one further terminal of the chip to the support element by said conductive through-element.

6. The method according to claim 5, wherein providing the coupling element comprises mounting, on said coupling element, an electronic component, and wherein said electrically connecting the conductive portion of said coupling element to at least one lead and to the at least one terminal of the chip comprises:

electrically connecting a first conductive portion of said conductive portion to a first terminal of the electronic component and to the at least one lead, and electrically connecting a second conductive portion of said conductive portion to a second terminal of the electronic component and to the at least one terminal of the chip, said second conductive portion being electrically insulated from the first conductive portion.

7. An electronic device, comprising:
an integrated circuit chip;
a lead frame including:
 a support element including a central region to which the integrated circuit chip is attached and a side region extending from at least one side of the integrated circuit chip; and
 a plurality of lead pins;
 a conductive interconnect structure including an insulating body mounted to the side region of the lead frame, said insulating body supporting at least one conductive element and said insulating body extending beyond a peripheral edge of the side region;
a first wire bond extending between a terminal of the integrated circuit chip and said conductive element; and
a second wire bond extending between said conductive element and one of said plurality of lead pins.

8. The electronic device of claim 7, wherein said conductive element includes a first end proximal to said integrated circuit chip and a second end proximal to said one of the lead pins and extended beyond said peripheral edge of the side region, said first wire bond connected to the first end and said second wire bond connected to the second end.

9. The electronic device of claim 7, wherein said conductive interconnect structure includes: a first conductive element and a second conductive element supported by said insulating body and separated from each other, said first wire bond connected to the first conductive element and said second wire bond connected to the second conductive element.

10. The electronic device of claim 9, further comprising a passive two terminal circuit component that is electrically connected between the first and second conductive elements.

11. The electronic device of claim 7, wherein the conductive interconnect structure includes a conductive via extending through the insulating body and in electrical connection with the support element of the lead frame, and further including a third wire bond end extending between a further terminal of the integrated circuit chip and said conductive via.

12. The electronic device of claim 11, wherein said via comprises a conductive line extending, in plan view, parallel to said at least one side of the integrated circuit chip.

* * * * *